(12) United States Patent
Wu

(10) Patent No.: US 11,605,651 B2
(45) Date of Patent: Mar. 14, 2023

(54) DISPLAY PANEL AND DISPLAY DEVICE

(71) Applicant: TCL China Star Optoelectronics Technology Co., Ltd., Shenzhen (CN)

(72) Inventor: Huanda Wu, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 528 days.

(21) Appl. No.: 16/626,325

(22) PCT Filed: Nov. 14, 2019

(86) PCT No.: PCT/CN2019/118381
§ 371 (c)(1),
(2) Date: Dec. 24, 2019

(87) PCT Pub. No.: WO2021/056752
PCT Pub. Date: Apr. 1, 2021

(65) Prior Publication Data
US 2021/0358961 A1   Nov. 18, 2021

(30) Foreign Application Priority Data
Sep. 26, 2019 (CN) .......................... 201910919408.1

(51) Int. Cl.
*H01L 27/12* (2006.01)
*G02F 1/1362* (2006.01)
*H01L 27/32* (2006.01)
*G02F 1/1368* (2006.01)

(52) U.S. Cl.
CPC ...... *H01L 27/124* (2013.01); *G02F 1/136272* (2021.01); *H01L 27/3276* (2013.01); *G02F 1/13685* (2021.01); *G02F 1/136209* (2013.01); *H01L 27/3246* (2013.01)

(58) Field of Classification Search
CPC ............... H01L 27/124; H01L 27/3276; H01L 27/3246; G02F 1/136272; G02F 1/13685; G02F 1/136209
USPC ........................................ 257/40; 438/82, 99
See application file for complete search history.

(56) References Cited

U.S. PATENT DOCUMENTS

| 2008/0068324 | A1  | 3/2008 | Chung et al. |  |
|---|---|---|---|---|
| 2015/0161943 | A1* | 6/2015 | Shim et al. | G09G 3/3225 345/76 |
| 2018/0033649 | A1* | 2/2018 | Noh et al. | H01L 27/3272 257/40 |

(Continued)

FOREIGN PATENT DOCUMENTS

| CN | 104600079 | 5/2015 |
|---|---|---|
| CN | 104700774 | 6/2015 |

(Continued)

*Primary Examiner* — Thinh T Nguyen

(57) ABSTRACT

A display panel and a display device are provided. A pixel electrode of the display panel includes a pixel electrode body and a pixel electrode extension. The pixel electrode body is positioned within the light-emitting section and the pixel electrode extension is positioned within the light-shielding section. When an insulating layer positioned on an overlapping section is perforated, the pixel electrode extension is electrically connected to the signal electrode of other sub-pixel units via a repair line, thereby solving a technical problem that existing display panels possess a limited effect on repairing bright spots.

13 Claims, 11 Drawing Sheets

(56) References Cited

U.S. PATENT DOCUMENTS

2018/0090547 A1\* 3/2018 Shin et al. .......... H01L 27/3211
2021/0335185 A1\* 10/2021 Wu et al. ............. G09G 3/2003

FOREIGN PATENT DOCUMENTS

| CN | 105741734 | 7/2016 |
|---|---|---|
| CN | 107425010 | 12/2017 |
| CN | 107515500 | 12/2017 |
| CN | 207134356 | 3/2018 |

\* cited by examiner

DISPLAY PANEL AND DISPLAY DEVICE

RELATED APPLICATIONS

This application is a National Phase of PCT Patent Application No. PCT/CN2019/118381 having International filing date of Nov. 14, 2019, which claims the benefit of priority of Chinese Patent Application No. 201910919408.1 filed on Sep. 26, 2019. The contents of the above applications are all incorporated by reference as if fully set forth herein in their entirety.

FIELD AND BACKGROUND OF THE INVENTION

The present application relates to a field of display technologies, and more particularly to a display panel and a display device.

As shown in FIG. 1, bright spots of existing panels are repaired to be dark spots by disconnecting the dotted frame of the drawing by a laser. Then, the malfunctional pixel electrode becomes a dark point, which has a limited effect on panel repairment.

Therefore, there is a technical problem that existing display panels have a limited effect on repairing bright spots.

SUMMARY OF THE INVENTION

The present disclosure provides a display panel and a display device for solving the technical problem that existing display panels have a limited effect on repairing bright spots.

In order to solve the above problem, a technical scheme provided by the present disclosure is as follows:

The present disclosure provides a display panel, comprising:

a substrate;

a driving circuit layer disposed on the substrate to form a signal electrode for driving the thin film transistor, wherein the signal electrode is a source electrode or a drain electrode;

a pixel electrode layer patterned to form a plurality of pixel electrodes of sub-pixel units, wherein each of the pixel electrode comprises a pixel electrode body and a pixel electrode extension that are electrically connected to each other; the pixel electrode body is positioned within a light-emitting section, the pixel electrode body is electrically connected to the signal electrode of the corresponding sub-pixel unit via a pixel signal line, and the pixel electrode extension is positioned within the light-shielding area;

a repair line layer patterned to form a repair line; and an insulating layer positioned between the repair line layer and the pixel electrode layer;

wherein a projection of the pixel electrode extension on the substrate partially overlaps a projection of the repair line on the substrate, and when the insulating layer of the overlapping section is perforated, the pixel electrode extension is electrically connected to the signal electrode of the other sub-pixel unit via the repair line.

In the display panel provided by the present disclosure, the display panel comprises a plurality of sub-pixel units disposed in an array, and when the insulating layer of the overlapping section is perforated, the pixel electrode extension is electrically connected to the signal electrode of the adjacent sub-pixel units via the repair line.

In the display panel provided by the present disclosure, both ends of the repair line are independently insulated from the pixel electrode extensions of the two sub-pixel units, and projections of the ends of the repair line on the substrate overlap projections of the pixel electrode extensions of the two sub-pixel units on the substrate, respectively.

In the display panel provided by the present disclosure, a connectional though hole is defined on the insulating layer, and a projection of one end of the repair line on the substrate overlaps a projection of a pixel electrode extension of one of the sub-pixel units on the substrate, and another end of the repair line is electrically connected to the pixel electrode extension of another sub-pixel unit via the connectional though hole.

In the display panel provided by the present disclosure, a connectional though hole is defined on the insulating layer, a projection of one end of the repair line on the substrate overlaps a projection of a pixel electrode extension of one sub-pixel units on the substrate, and another end of the repair line is directly electrically connected to the signal electrode of another sub-pixel unit.

In the display panel provided by the present disclosure, the display panel is a liquid crystal display panel, the liquid crystal display panel comprises a substrate, a light-shielding layer, a buffer layer and a driving circuit layer that are stacked in turn, the driving circuit layer comprises an active layer, a gate insulating layer, a first metal layer, a first inter-insulating layer, a second metal layer, a second inter-insulating layer, a source and drain layer, a planarization layer, a pixel electrode layer, and an alignment film layer that are stacked in turn, and the repair line layer is disposed between the substrate and the planarization layer.

In the display panel provided by the present disclosure, the light-shielding layer and the repair line layer are disposed on a same layer, and the repair line layer is patterned to form a repair line and a light-shielding layer that corresponds to a position of a thin film transistor.

In the display panel provided by the present disclosure, the source and drain layer and the repair line layer are disposed in a same layer, the repair line layer is patterned to form a repair line, a source of the thin film transistor, and a drain of the thin film transistor.

In the display panel provided by the present disclosure, the display panel is an organic light-emitting diode (OLED) display panel, the OLED display panel comprises a substrate, a light-shielding layer, a buffer layer and a driving circuit layer that are stacked in turn, the driving circuit layer comprises an active layer, a gate insulating layer, a first metal layer, a first inter-insulating layer, a second metal layer, a second inter-insulating layer, a source and drain layer, a planarization layer, a pixel defining layer, a pixel electrode layer, a light-emitting function layer, a common electrode layer, and an encapsulation layer that are stacked in turn, and the repair line layer is disposed between the substrate and the encapsulation layer.

In the display panel provided by the present disclosure, the common electrode layer and the repair line layer are disposed in the same layer, the common electrode layer is patterned to form a repair line and a common electrode, and the repair line is insulated from the common electrode.

In the display panel provided by the present disclosure, the pixel defining layer is patterned to form a protruding section, the protruding section is configured to define a light-emitting section, and the pixel electrode extension is positioned within the protruding section.

In the display panel provided by the present disclosure, the pixel electrode extension is integrally formed with the pixel electrode body and the pixel electrode extension is positioned between the pixel defining layer and the planarization layer.

In the display panel provided by the present disclosure, the pixel electrode extension is disposed separately from the pixel electrode body, the pixel electrode extension is laid on a top surface of the protruding section and an incline of a corresponding light-emitting section of the protruding section, and the pixel electrode extension is connected to the pixel electrode body.

The present disclosure provides a display device comprising a display panel, wherein the display panel comprises:
a substrate;
a driving circuit layer disposed on the substrate to form a signal electrode for driving the thin film transistor, wherein the signal electrode is a source electrode or a drain electrode;
a pixel electrode layer patterned to form a plurality of pixel electrodes of sub-pixel units, wherein each of the pixel electrode comprises a pixel electrode body and a pixel electrode extension that are electrically connected to each other; the pixel electrode body is positioned within a light-emitting section, the pixel electrode body is electrically connected to the signal electrode of the corresponding sub-pixel unit via a pixel signal line, and the pixel electrode extension is positioned within the light-shielding area;
a repair line layer patterned to form a repair line; and
an insulating layer positioned between the repair line layer and the pixel electrode layer;
wherein a projection of the pixel electrode extension on the substrate partially overlaps a projection of the repair line on the substrate, and when the insulating layer of the overlapping section is perforated, the pixel electrode extension is electrically connected to the signal electrode of the other sub-pixel unit via the repair line.

In the display panel provided by the present disclosure, the display device comprises a plurality of sub-pixel units disposed in an array, and when the insulating layer of the overlapping section is perforated, the pixel electrode extension is electrically connected to the signal electrode of the adjacent sub-pixel units via the repair line.

In the display panel provided by the present disclosure, both ends of the repair line are independently insulated from the pixel electrode extensions of the two sub-pixel units, and projections of the ends of the repair line on the substrate overlap projections of the pixel electrode extensions of the two sub-pixel units on the substrate, respectively.

In the display panel provided by the present disclosure, a connectional though hole is defined on the insulating layer, and a projection of one end of the repair line on the substrate overlaps a projection of a pixel electrode extension of one of the sub-pixel units on the substrate, and another end of the repair line is electrically connected to the pixel electrode extension of another sub-pixel unit via the connectional though hole.

In the display panel provided by the present disclosure, a connectional though hole is defined on the insulating layer, a projection of one end of the repair line on the substrate overlaps a projection of a pixel electrode extension of one sub-pixel units on the substrate, and another end of the repair line is directly electrically connected to the signal electrode of the another sub-pixel unit.

In the display panel provided by the present disclosure, the display device is a liquid crystal display device, the liquid crystal display device comprises a substrate, a light-shielding layer, a buffer layer and a driving circuit layer that are stacked in turn, the driving circuit layer comprises an active layer, a gate insulating layer, a first metal layer, a first inter-insulating layer, a second metal layer, a second inter-insulating layer, a source and drain layer, a planarization layer, a pixel electrode layer, and an alignment film layer that are stacked in turn, and the repair line layer is disposed between the substrate and the planarization layer.

In the display panel provided by the present disclosure, the light-shielding layer and the repair line layer are disposed on a same layer, and the repair line layer is patterned to form a repair line and a light-shielding layer that corresponds to a position of a thin film transistor.

Beneficial effects of the present disclosure are as follows: the present disclosure provides a display panel and a display device. The display panel includes a substrate, a driving circuit layer, a pixel electrode layer, a repair line layer, and an insulating layer. The driving circuit layer is disposed on the substrate to form a signal electrode that drives a thin-film transistor. The signal electrode is a source electrode or a drain electrode. The pixel electrode layer is patterned to form a plurality of pixel electrodes of sub-pixel units. Each of the pixel electrode includes a pixel electrode body and a pixel electrode extension that are electrically connected to each other. The pixel electrode body is positioned within a light-emitting section. The pixel electrode body is electrically connected to the signal electrode of the corresponding sub-pixel unit via a pixel signal line. The pixel electrode extension is positioned within the light-shielding area. The repair line layer is patterned to form a repair line. The insulating layer is positioned between the repair line layer and the pixel electrode layer. A projection of the pixel electrode extension on the substrate partially overlaps a projection of the repair line on the substrate. When the insulating layer of the overlapping section is perforated, the pixel electrode extension is electrically connected to the signal electrode of another sub-pixel unit via the repair line. Therefore, when a bright spot appears in the sub-pixel units, the pixel electrode of the sub-pixel unit is disconnected from the corresponding pixel circuit by a laser. Then the pixel electrode extension is connected to the signal electrode of the other sub-pixel units via the repair line by a laser, thereby solving the technical problem that existing display panels have a limited effect on repairing bright spots.

BRIEF DESCRIPTION OF THE SEVERAL VIEWS OF THE DRAWINGS

In order to illustrate technical solutions in the embodiments or in the prior art more clearly, the accompanying drawings required in the description of the embodiments or the prior art are introduced briefly hereafter. It is obvious that the accompanying drawings in the following description are merely part of the embodiments of the present disclosure. People with ordinary skills in the art can obtain other drawings without making inventive efforts.

DESCRIPTION OF SPECIFIC EMBODIMENTS OF THE INVENTION

In the following detailed description, reference is made to the accompanying figures, in which various examples are shown by way of illustration. In this regard, directional terminology mentioned in the present disclosure, such as "top", "bottom", "front", "back", "left", "right", "inner", "outer", "lateral", etc., is used with reference to the orientation of the figures being described. Therefore, the directional terminology is used for purposes of illustration and is not intended to limit the present invention. In the accompanying figures, units with similar structures are indicated by the same reference numbers.

The present disclosure embodiment can solve this problem in view of the technical problem that existing display panels have a limited effect on repairing bright spots.

Figure 9:
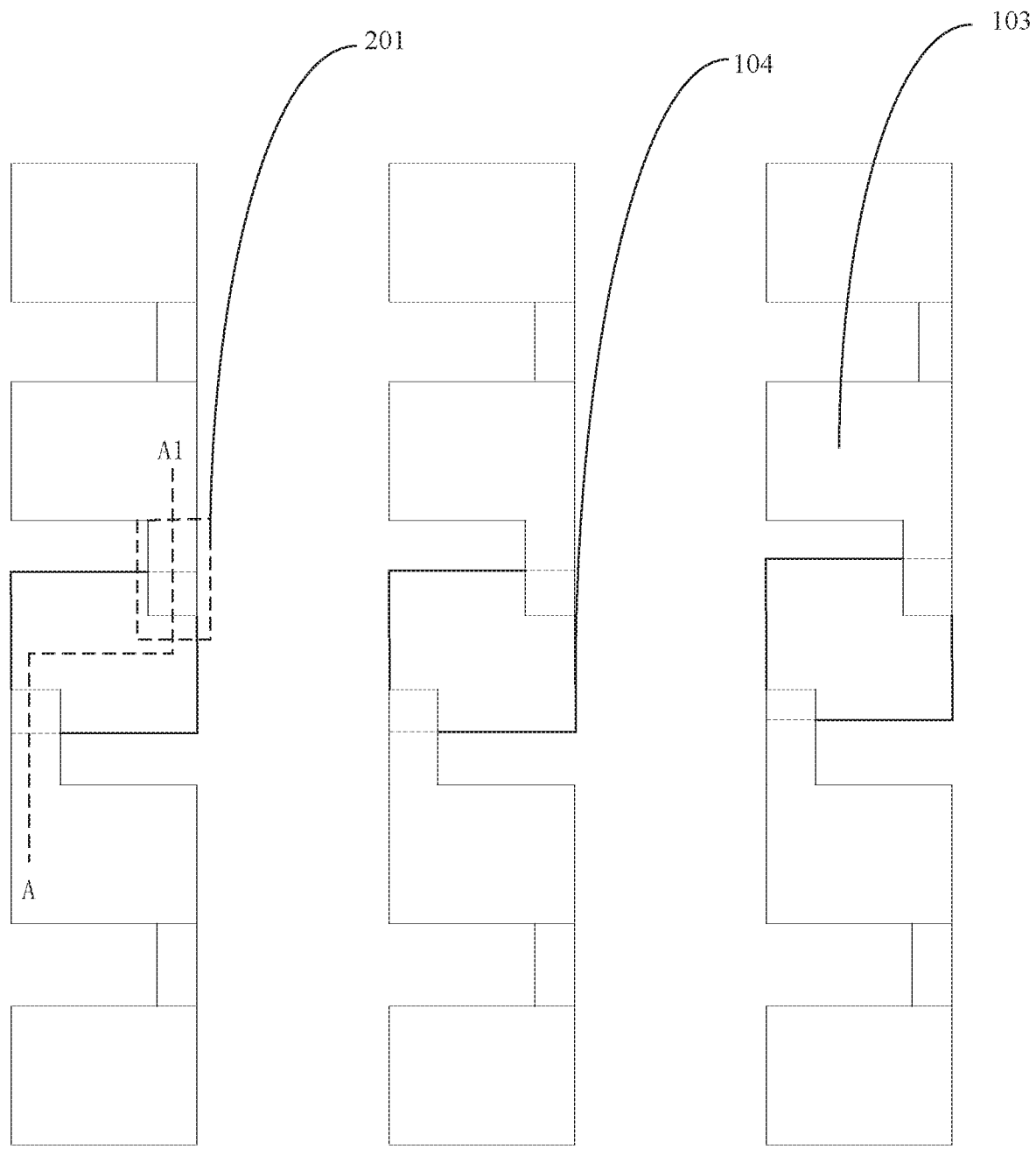
FIG. 9 is a first schematic top view of a display panel provided by an embodiment of the present disclosure.

As shown in FIG. 9, the cross-sectional position of the schematic cross-sectional view of the present disclosure is A-A1.

Figure 1:
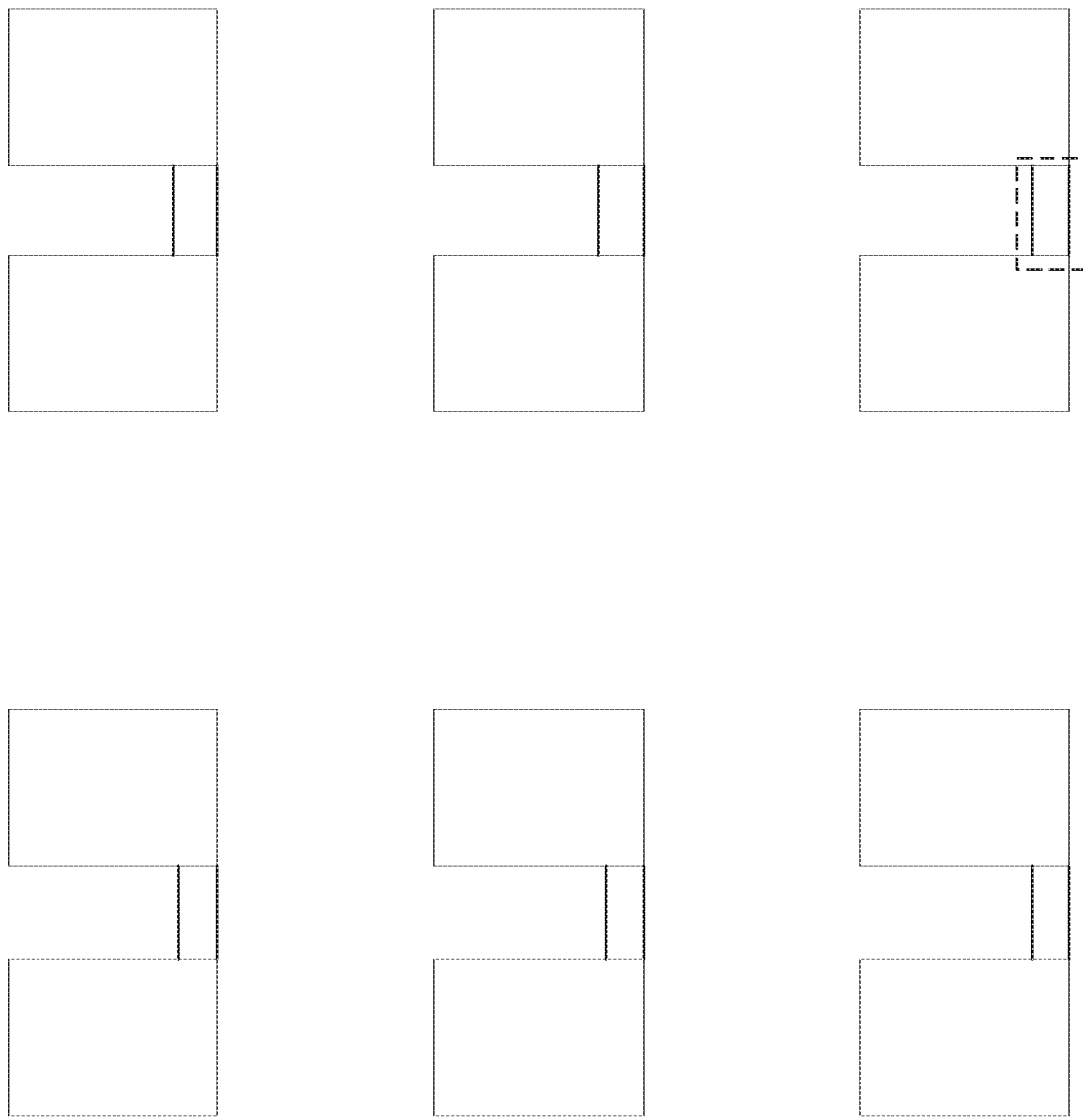
FIG. 1 is a schematic top view of an existing display panel.
Figure 2:
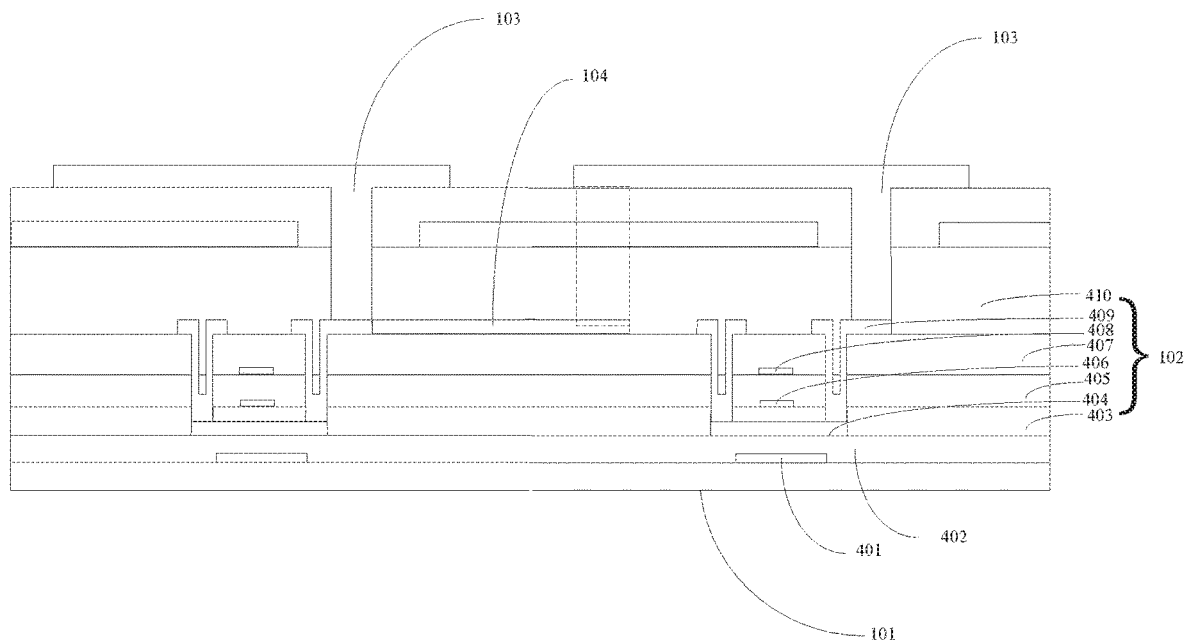
FIG. 2 is a first schematic cross-sectional view of a display panel provided by an embodiment of the present disclosure.

The display panel provided by the present disclosure is as shown in FIG. 2 and the dotted frame is a position of an insulating layer that needs to be punctured by a laser when the sub-pixel presents a bright spot. The display panel includes a substrate 101, a driving circuit layer 102, a pixel electrode layer 103, a repair line layer 104, and an insulating layer. The driving circuit layer 102 is disposed on the substrate to form a signal electrode for driving the thin-film transistor. The signal electrode is a source electrode or a drain electrode. The pixel electrode layer 103 is patterned to form a plurality of pixel electrodes of sub-pixel units. Each of the pixel electrode includes a pixel electrode body 202 and a pixel electrode extension 201 that are electrically connected to each other. The pixel electrode body 202 is positioned within a light-emitting section and the pixel electrode body 202 is electrically connected to a signal electrode of a corresponding sub-pixel unit via a pixel signal line. The pixel electrode extension is positioned within the light-shielding section. The repair line layer 104 is patterned to form a repair line. The insulating layer is positioned between the repair line layer 104 and the pixel electrode layer 103. A projection of the pixel electrode extension 201 on the substrate partially overlaps a projection of the repair line on the substrate. When the insulating layer of the overlapping section is perforated, the pixel electrode extension 201 is electrically connected to the signal electrodes of the other sub-pixel units via the repair line.

In the present embodiment, the display panel includes a substrate, a driving circuit layer, a pixel electrode layer, a repair line layer, and an insulating layer. The driving circuit layer is disposed on the substrate to form a signal electrode for driving the thin-film transistor. The signal electrode is a source electrode or a drain electrode. The pixel electrode layer is patterned to form a plurality of pixel electrodes of sub-pixel units. Each of the pixel electrode includes a pixel electrode body and a pixel electrode extension that are electrically connected. The pixel electrode body is positioned within the light-emitting section. The pixel electrode body is electrically connected to the signal electrode of the corresponding sub-pixel unit via a pixel signal line. The pixel electrode extension is positioned within the light-shielding section. The repair line layer is patterned to form a repair line. The insulating layer is positioned between the repair line layer and the pixel electrode layer. A projection of the pixel electrode extension on the substrate partially overlaps a projection of the repair line on the substrate. When the insulating layer of the overlapping section is perforated, the pixel electrode extension is electrically connected to the signal electrodes of the other sub-pixel units via the repair line. Therefore, when the sub-pixel unit presents a bright spot, the pixel electrode of the sub-pixel unit is disconnected from the corresponding pixel circuit, and then the pixel electrode extension is connected to the signal electrode of the other sub-pixel units via the repair line by the laser to emit light, thereby solving the technical problem that existing display panels have a limited effect on repairing bright spots.

In an embodiment, as shown in FIG. 2, the source drain layer 409 and the repair line layer 104 are disposed in a same layer. The repair line layer 104 is patterned to form a repair line, a source of the thin-film transistor, and a drain of the thin-film transistor.

Figure 3:
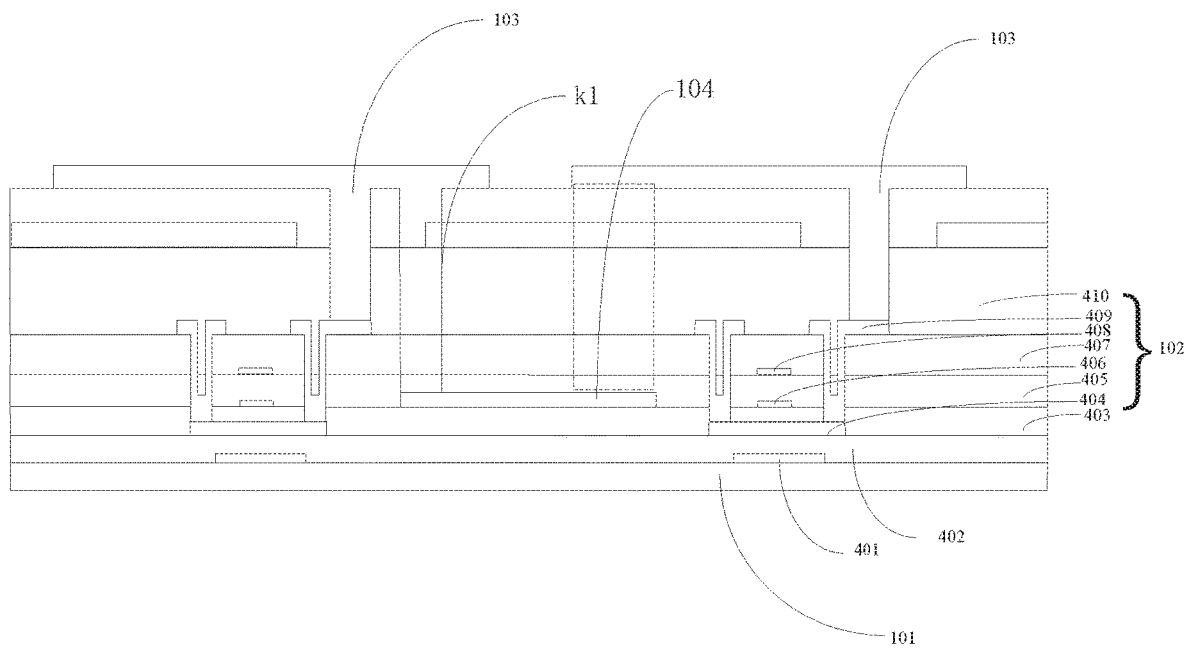
FIG. 3 is a second schematic cross-sectional view of a display panel provided by an embodiment of the present disclosure.

In an embodiment, as shown in FIG. 3, a connectional though hole k1 is defined on the insulating layer. A projection of one end of the repair line on the substrate overlaps a projection of the pixel electrode extension 201 of one sub-pixel unit. Another end of the repair line is connected to the pixel electrode of another sub-pixel unit via the connectional though hole k1.

Figure 4:
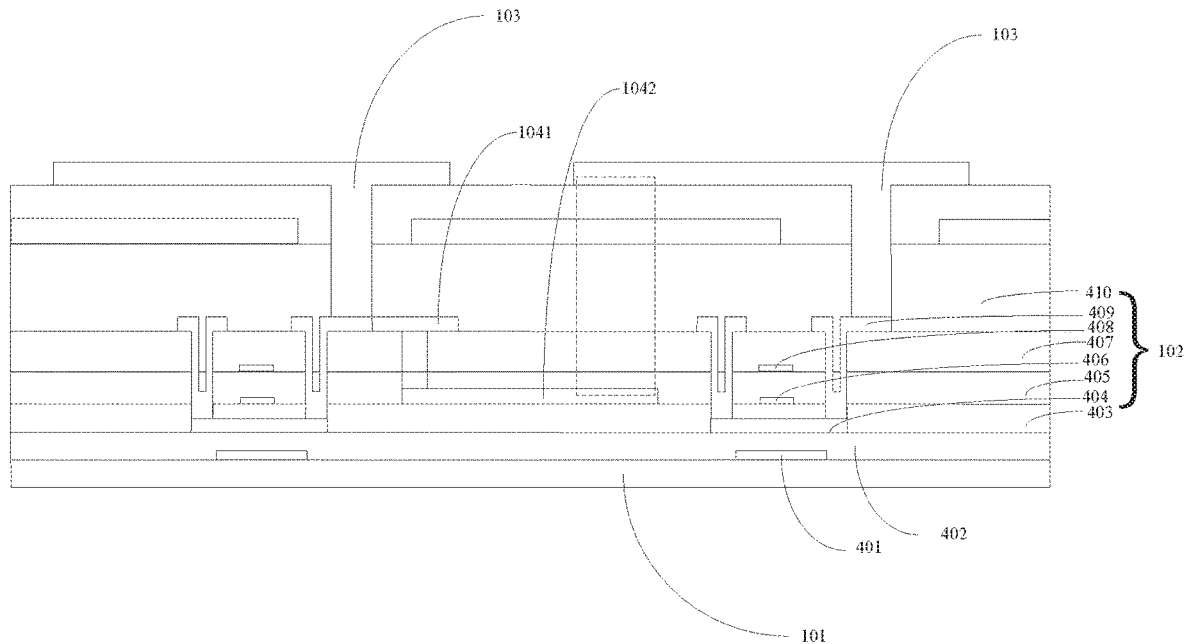
FIG. 4 is a third schematic cross-sectional view of a display panel provided by an embodiment of the present disclosure.

In an embodiment, as shown in FIG. 4, the repair line layer 104 includes a first repair line layer 1041 and a second repair line layer 1042. The first repair line layer 1041 and the second repair line layer 1042 are connected by the repair line though hole and are patterned to form a repair line.

Figure 5:
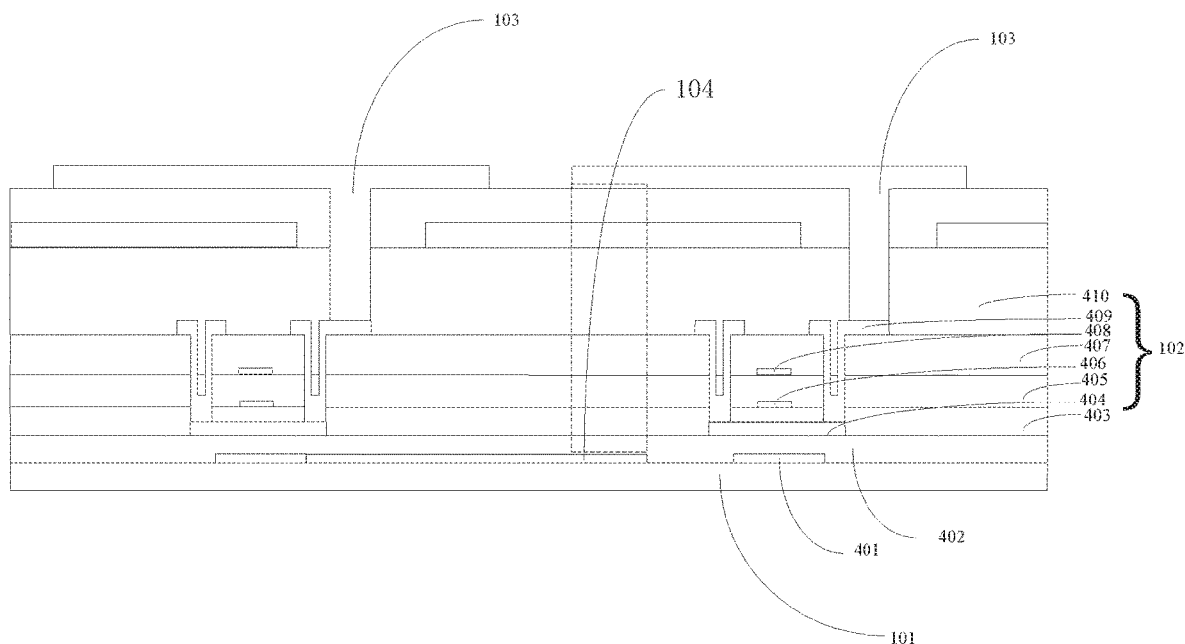
FIG. 5 is a fourth schematic cross-sectional view of a display panel provided by an embodiment of the present disclosure.

In an embodiment, as shown in FIG. 5, the light-shielding layer 401 and the repair line layer 104 are disposed in a same layer. The repair line layer 104 is patterned to form a repair line and a light-shielding layer 401 corresponding to the position of the thin-film transistor.

In an embodiment, both ends of the repair line are respectively insulated from the pixel electrode extensions 201 of the two sub-pixel units, and the projections coincide on the substrate.

In an embodiment, the insulating layer is disposed with a connectional though hole, one end of the repair line is projected onto the substrate 101 with the pixel electrode extension of one sub-pixel unit. Projections of the ends of the repair line on the substrate 101 overlap projections of the pixel electrode extensions of the two sub-pixel units on the substrate, respectively.

In an embodiment, a portion of the repair line is used as a light-shielding layer.

Figure 6:
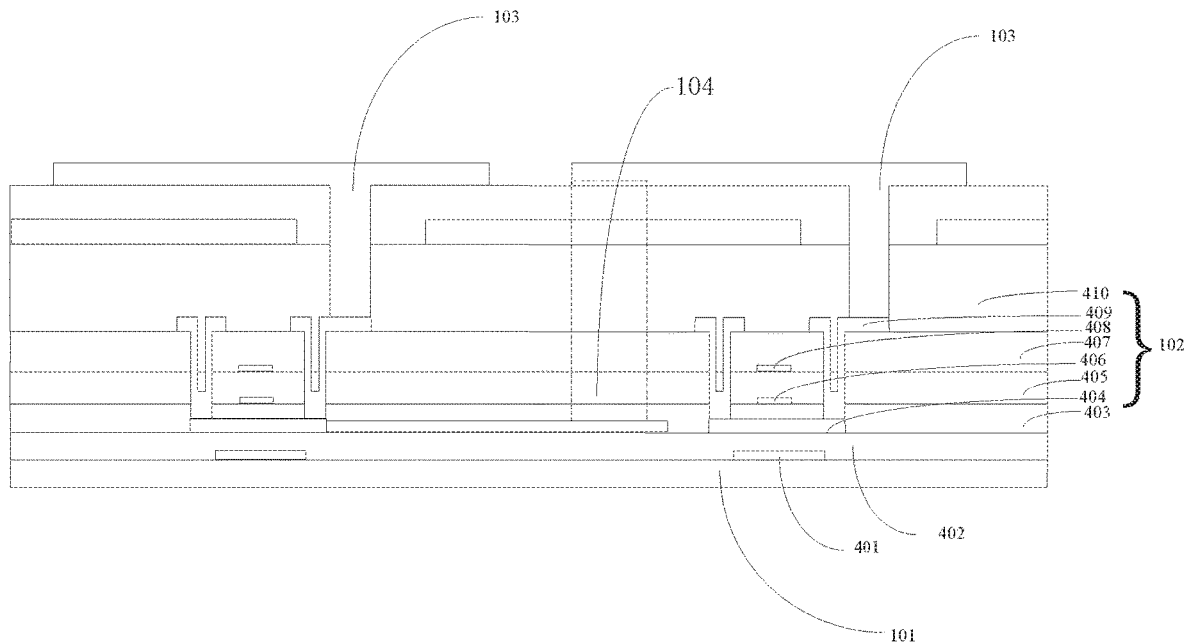
FIG. 6 is a fifth schematic cross-sectional view of a display panel provided by an embodiment of the present disclosure.

In an embodiment, as shown in FIG. 6, the active layer 404 and the repair line layer 104 are disposed in a same layer. The active layer is patterned to form the repair line layer 104.

Figure 7:
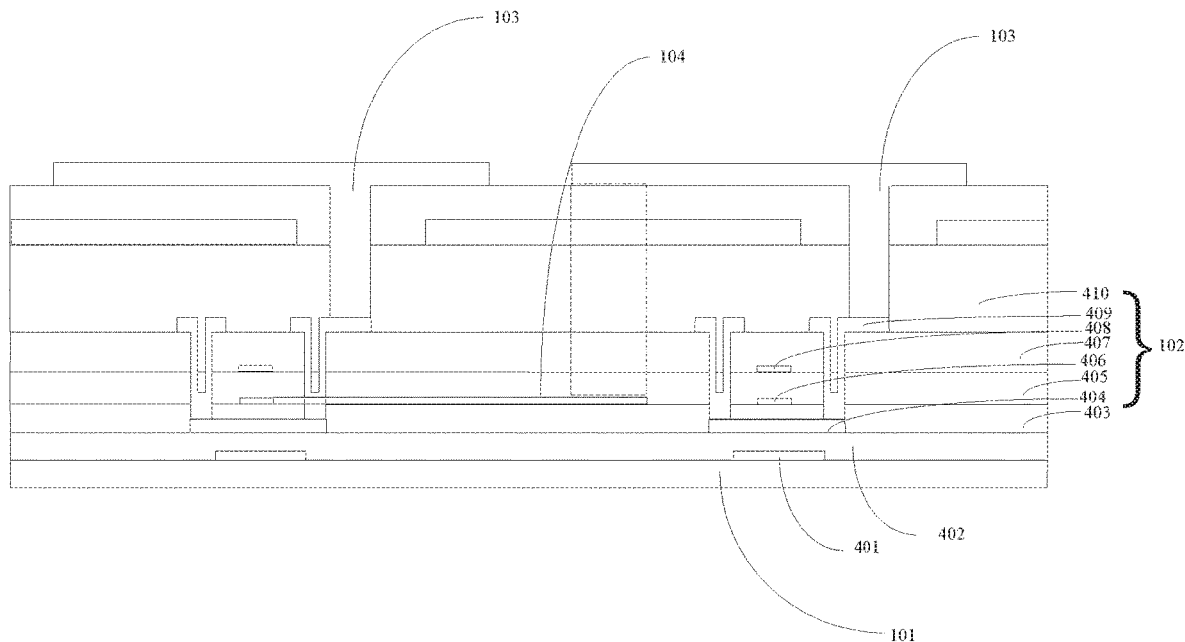
FIG. 7 is a sixth schematic cross-sectional view of a display panel provided by an embodiment of the present disclosure.

In an embodiment, as shown in FIG. 7, the first metal layer 406 and the repair line layer 104 are disposed in a same layer. The repair line layer 104 is patterned to form a repair line, a gate of the low temperature polysilicon thin-film transistor, and a first electrode plate of a storage capacitor.

Figure 8:
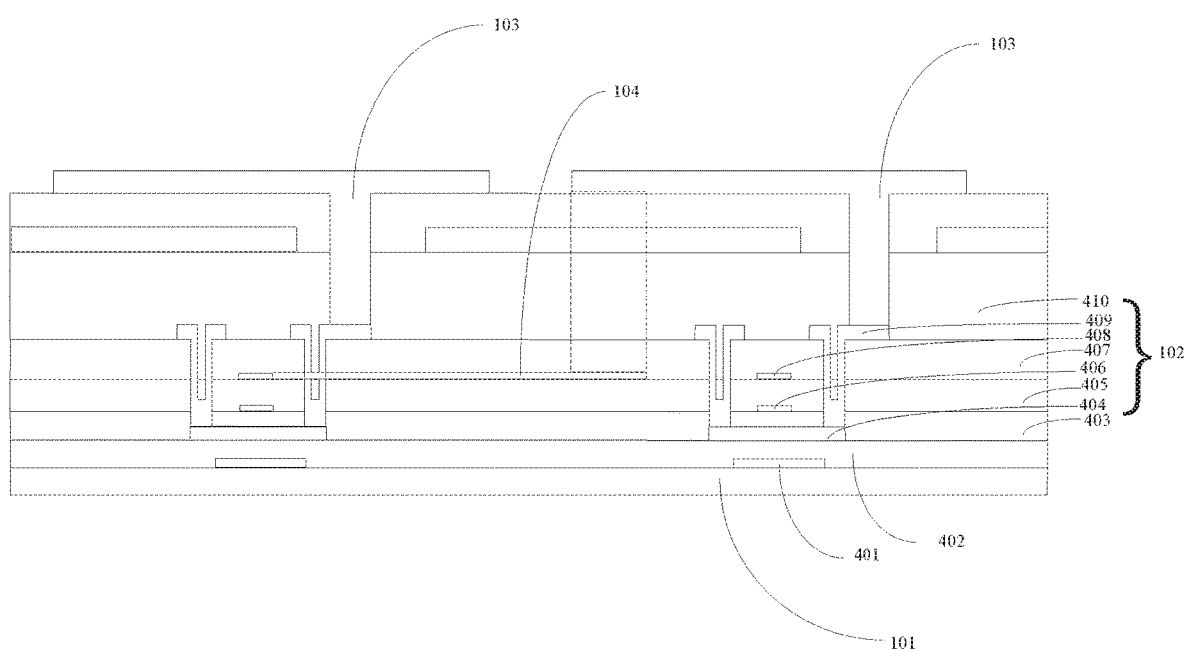
FIG. 8 is a seventh schematic cross-sectional view of a display panel provided by an embodiment of the present disclosure.

In an embodiment, as shown in FIG. 8, the second metal layer 408 and the repair line layer 104 are disposed in a same layer. The repair line layer 104 is patterned to form a repair line, a gate of the metal semiconductor oxide thin-film transistor, and a second electrode plate of a storage capacitor.

In an embodiment, as shown in FIG. 9, the display panel includes a plurality of sub-pixel units disposed in an array. When the insulating layer of the overlapping section is perforated, the pixel electrode extension is electrically connected to the signal electrode of the adjacent sub-pixel unit via the repair line.

In an embodiment, as shown in FIG. 9, the display panel includes a plurality of pixel units disposed in an array. The pixel unit includes a plurality of sub-pixel units having different colors of light; when the insulating layer of the overlapping area is perforated, the pixel electrode extension is electrically connected to the signal electrodes of the sub-pixel units that has a same color of light in the adjacent pixel units via the repair line is.

In an embodiment, the display panel is a liquid crystal display panel. The liquid crystal display panel includes a substrate 101, a light-shielding layer 401, a buffer layer 402, and a driving circuit layer 102 that are stacked in turn. The driving circuit layer 102 includes an active layer 404, a gate insulating layer 403, a first metal layer 406, a first inter-insulating layer 405, a second metal layer 408, a second inter-insulating layer 407, a source/drain layer 409, a planarization layer 410, a pixel electrode layer 105, and an alignment film that are stacked in turn. The repair line layer 104 is disposed between the substrate 101 and the planarization layer 410.

In an embodiment, in the liquid crystal display panel, the repairing line layer 104 is disposed between the substrate 101 and the light-shielding layer 401. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In an embodiment, in the liquid crystal display panel, the repairing line layer 104 is disposed between the light-shielding layer 401 and a buffer layer 402. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In an embodiment, in the liquid crystal display panel, the repairing line layer 104 is disposed between the buffer layer 402 and a gate insulating layer 403. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In an embodiment, in the liquid crystal display panel, the repairing line layer 104 is disposed between the gate insulating layer 403 and a first inter-insulating layer 405. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In an embodiment, in the liquid crystal display panel, the repairing line layer 104 is disposed between the first inter-insulating layer 405 and a second inter-insulating layer 407. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In an embodiment, in the liquid crystal display panel, the repairing line layer 104 is disposed between the second inter-insulating layer 407 and a planarization layer 410. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

Figure 10:
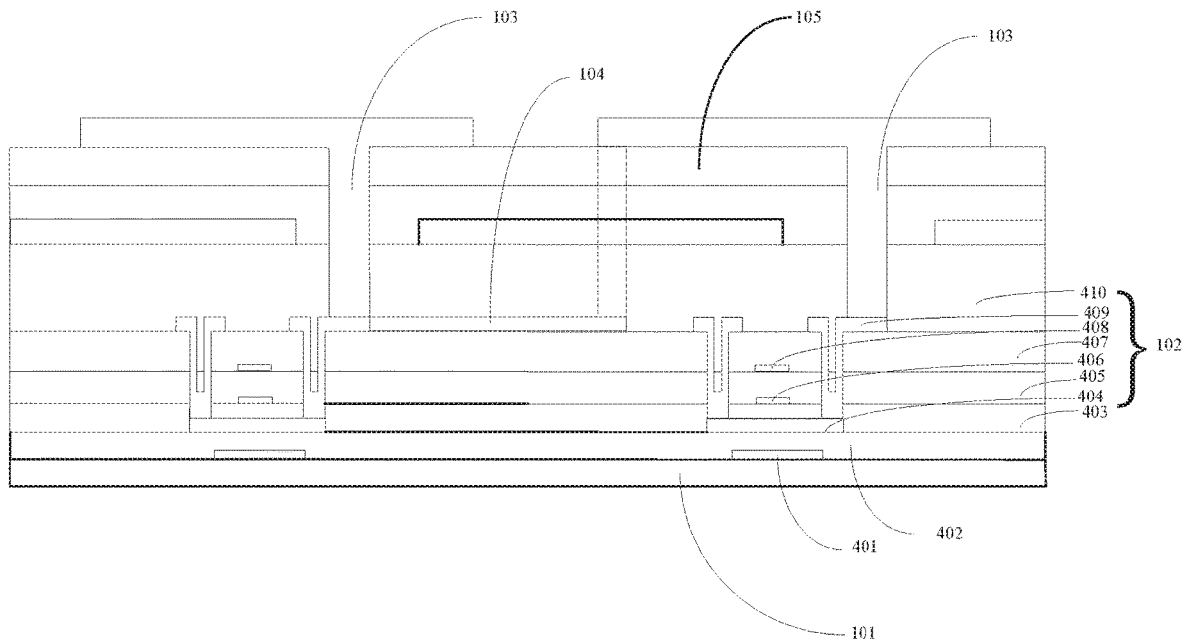
FIG. 10 is an eighth schematic cross-sectional view of a display panel provided by an embodiment of the present disclosure.

In an embodiment, as shown in FIG. 10, the display panel is an organic light-emitting diode (OLED) display panel, and the OLED display panel includes a substrate 101, a light-shielding layer 401, a buffer layer 402, and a driving circuit layer 102 that are stacked in turn. The driving circuit layer 102 includes an active layer 404, a gate insulating layer 403, a first metal layer 406, a first inter-insulating layer 405, a second metal layer 408, a second inter-insulating layer 407, a source/drain layer 409, a planarization layer 410, a pixel definition layer 105, a pixel electrode layer 103, a light-emitting function layer, a common electrode layer, and an encapsulation layer that are stacked in turn. The encapsulation layer is disposed between the substrate and the encapsulation layer.

In an embodiment, as shown in FIG. 10, in the OLED display panel, the display panel includes a pixel defining layer. The pixel electrode extension 201 is disposed on the pixel defining layer. A laser is required for the pixel electrode extension 201 to penetrate the pixel defining layer in order to electrically connect to the repair line.

In an embodiment, in the OLED display panel, the display panel includes a pixel defining layer. The pixel electrode extension 201 is integrally formed with the pixel electrode body 202. The pixel electrode extension 201 is positioned between the pixel defining layer 105 and the planarization layer 410. A laser is not required for the pixel electrode extension 201 to penetrate the pixel definition layer to electrically connect to the repair line.

In an embodiment, in the OLED display panel, the common electrode layer and the repair line layer are disposed in a same layer. The common electrode layer is patterned to form a repair line and a common electrode. The repair line is insulated from the common electrode.

In an embodiment, in the OLED display panel, the pixel defining layer 105 is patterned to form a protruding section to define a light-emitting section. The pixel electrode extension 201 is positioned within the protruding section.

In an embodiment, in the OLED display panel, the pixel electrode extension is disposed separately from the pixel electrode body. The pixel electrode extension is laid on a top surface of the protruding section and an incline of a corresponding light-emitting section of the protruding section. The pixel electrode extension is connected to the pixel electrode body.

In an embodiment, as shown in FIG. 10, the repair line layer is formed by extending the source drain layer 409. The pixel electrode extension overlaps a projection of the repair line layer on the substrate.

In an embodiment, in the OLED display panel, the repair line is positioned within the protruding section.

Figure 11:
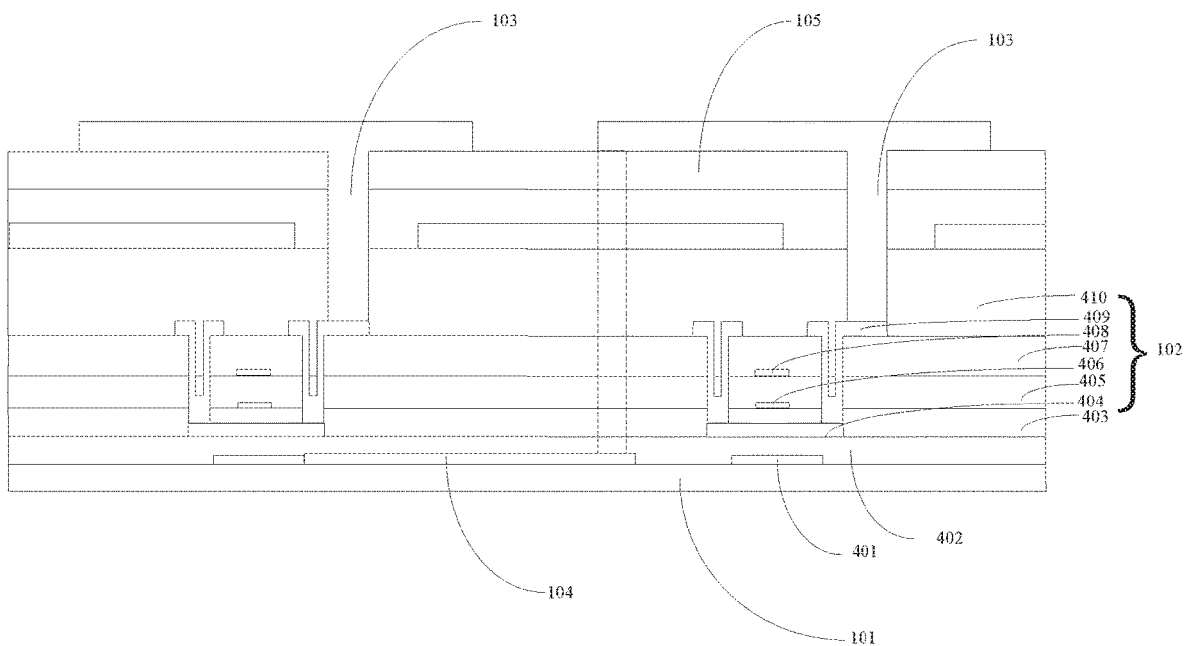
FIG. 11 is a ninth schematic cross-sectional view of a display panel provided by an embodiment of the present disclosure.

In an embodiment, as shown in FIG. 11, the light-shielding layer 401 and the repair line layer are disposed in a same layer. The light-shielding layer 401 is patterned to form a repair line layer.

Figure 12:
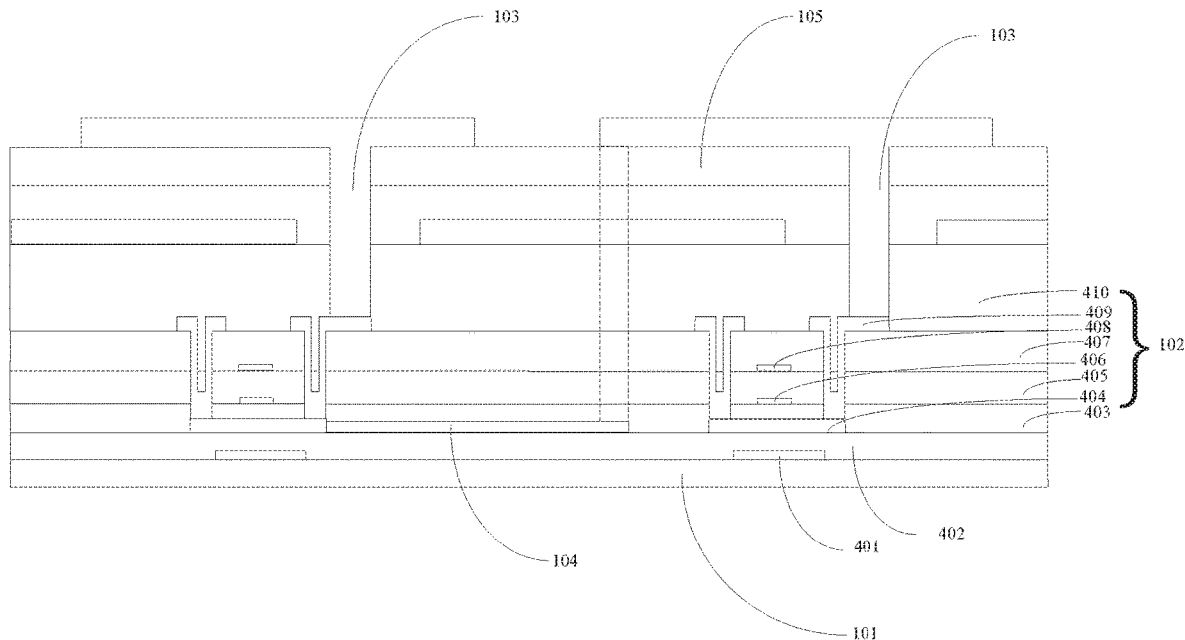
FIG. 12 is a tenth schematic cross-sectional view of a display panel provided by an embodiment of the present disclosure.

In an embodiment, as shown in FIG. 12, the active layer 404 and the repair line layer are disposed in a same layer. The active layer 404 is patterned to form a repair line layer.

Figure 13:
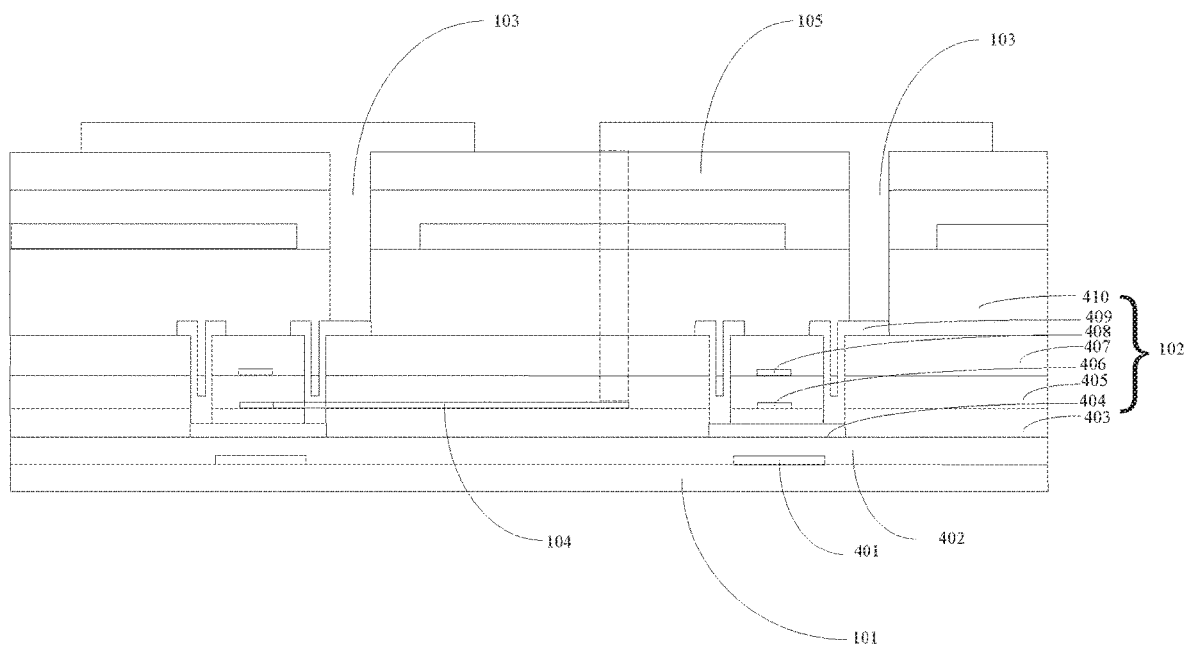
FIG. 13 is an eleventh schematic cross-sectional view of a display panel provided by an embodiment of the present disclosure.

In an embodiment, as shown in FIG. 13, the first metal layer 406 and the repair line layer are disposed in a same layer. The first metal layer 406 is patterned to form the repair line layer. The second metal layer 408 and the repair line layer is disposed in a same layer. The second metal layer 408 is patterned to form a repair line layer.

Figure 14:
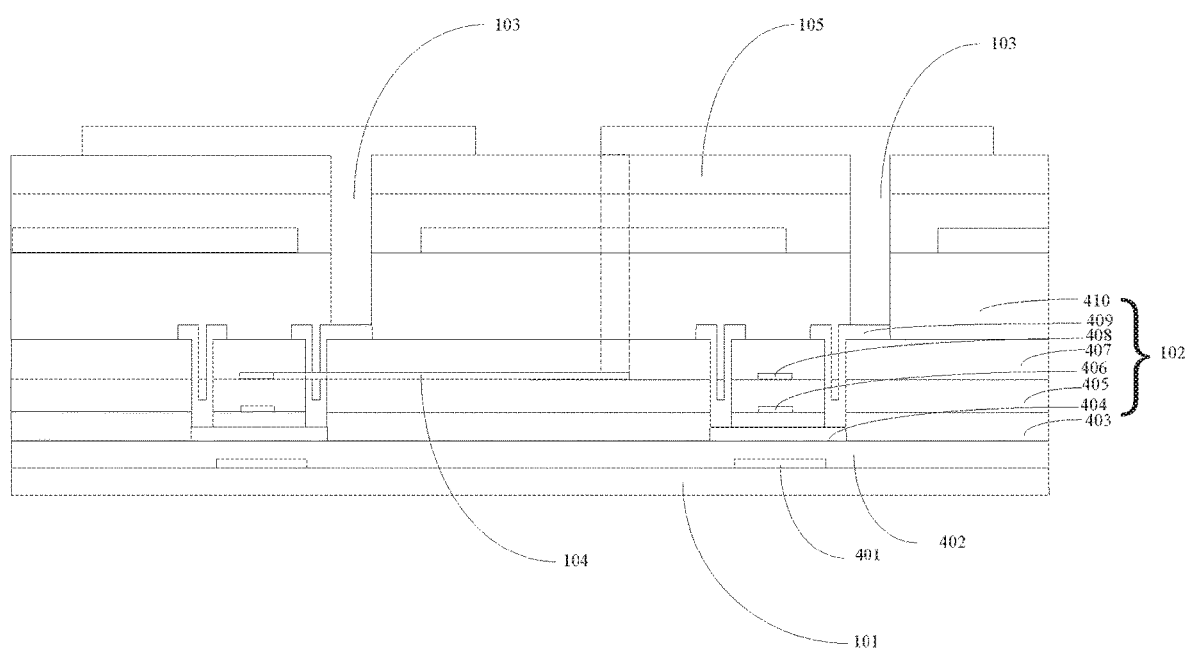
FIG. 14 is a twelfth schematic cross-sectional view of a display panel provided by an embodiment of the present disclosure.

In an embodiment, as shown in FIG. 14, the second metal layer 408 and the repair line layer are disposed in a same layer. The second metal layer 408 is patterned to form a repair line layer.

In an embodiment, the repair line is electrically connected to the signal electrode of the driving thin-film transistor.

In one embodiment, in the OLED display panel, the repairing line layer 104 is disposed between the substrate 101 and the light-shielding layer 401. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In one embodiment, in the OLED display panel, the repairing line layer 104 is disposed between the light-shielding layer 401 and a buffer layer 402. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In one embodiment, in the OLED display panel, the repairing line layer 104 is disposed between the buffer layer 402 and a gate insulating layer 403. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In one embodiment, in the OLED display panel, the repairing line layer 104 is disposed between the gate insulating layer 403 and a first inter-insulating layer 405. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In one embodiment, in the OLED display panel, the repairing line layer 104 is disposed between the first inter-insulating layer 405 and a second inter-insulating layer 407. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In one embodiment, in the OLED display panel, the repairing line layer 104 is disposed between the second inter-insulating layer 407 and a source and drain layer 409. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In one embodiment, in the OLED display panel, the repairing line layer 104 is disposed between the source and drain layer 409 and a planarization layer 410. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In an embodiment, one end of the repair line is connected to the pixel electrode extension 201 to be repaired. A projection of another end of the repair line on the substrate 101 overlaps the pixel electrode extension on a same row. The pixels on the same row include the same pixels and different pixels.

Figure 15:
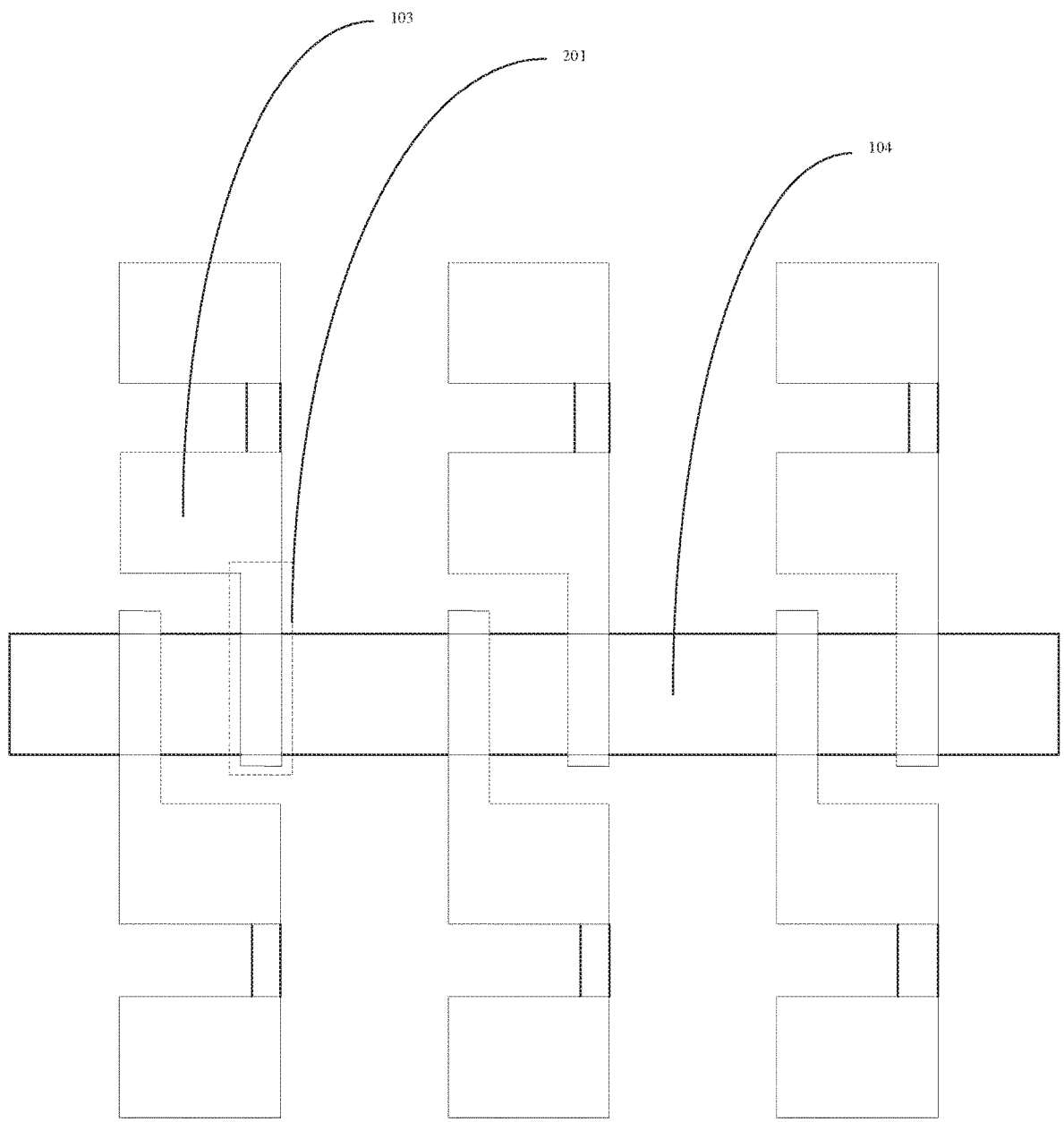
FIG. 15 is a second schematic top view of a display panel provided by an embodiment of the present disclosure.

In an embodiment, as shown in FIG. 15, the pixel electrode extension 201 is disposed adjacent to the light-emitting section of the next pixel electrode. In the OLED display panel, the pixel electrode extension 201 is adjacent to the next light-emitting section of the next pixel electrode. Therefore, such arrangement of the pixel electrode extension 201 can achieve a good connection effect.

In an embodiment, as shown in FIG. 15, an entire layer of the repair line is disposed in a strip shape. The projection of the repair line on the substrate overlaps the projections of all of the pixel electrode extensions.

Figure 16:
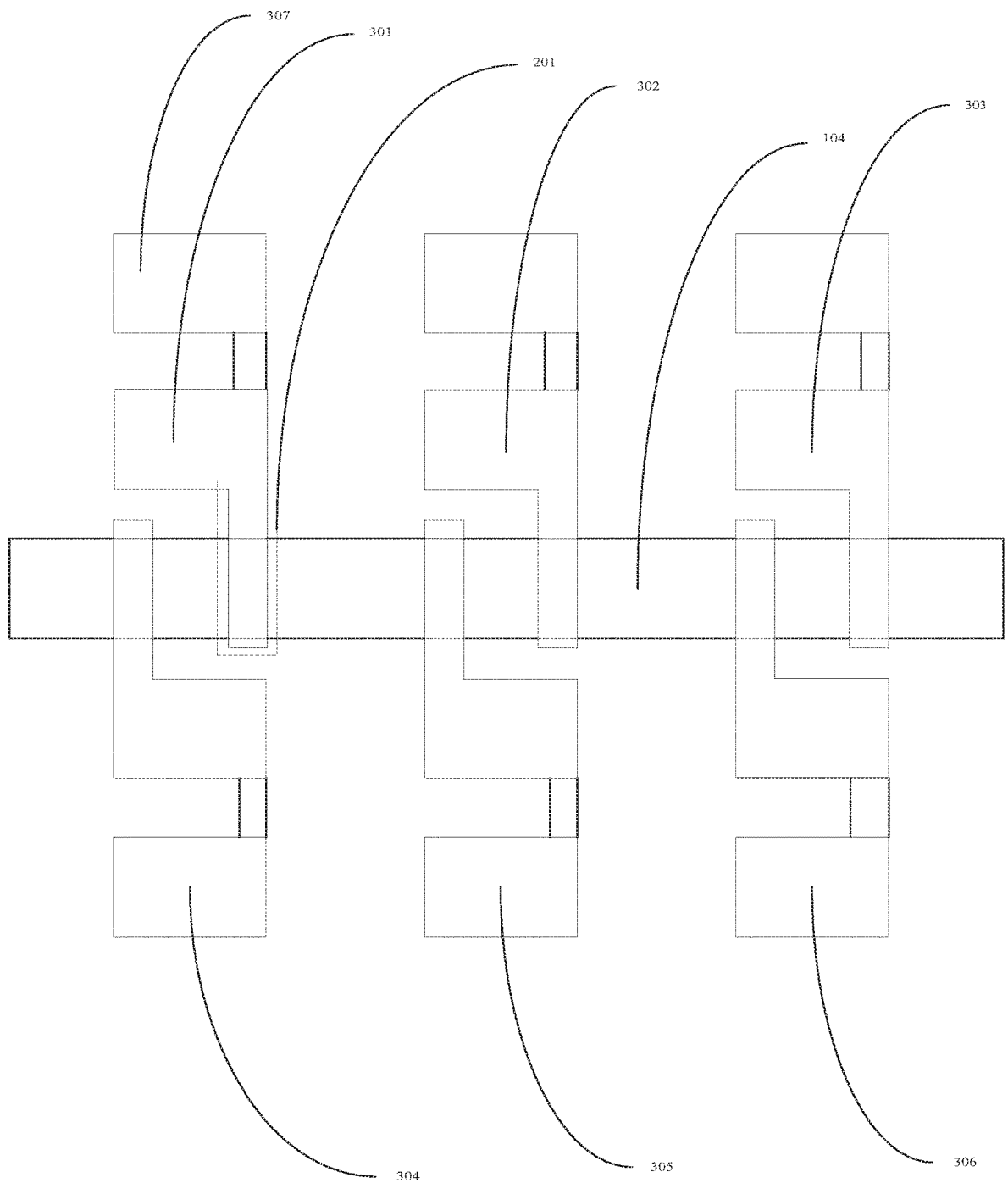
FIG. 16 is a third schematic top view of a display panel provided by an embodiment of the present disclosure.

In an embodiment, as shown in FIG. 16, two oppositely disposed pixels are used as an example. The pixels can be divided into pixels electrodes of six sub-pixels as follows: a first pixel electrode 301, a second pixel electrode 302, a third pixel electrode 303, a fourth pixel electrode 304, a fifth pixel electrode 305, and a sixth pixel electrode 306. The pixels further include a pixel circuit 307.

In an embodiment, the first pixel electrode 301 is connected to the second pixel electrode 302 via the repair line. Both the first pixel electrode 301 and the second pixel electrode 302 belong to the first pixel and belong to the intra-pixel common pixel circuit 307. The repair line is disposed under film layers of the pixel electrode extension 201 of the first pixel electrode 301 and the pixel electrode extension 201 of the second pixel electrode 302. When the first pixel electrode 301 presents a bright spot, the pixel electrode extension of the first pixel electrode 301 and the pixel electrode extension of the second pixel electrode 302 are irradiated by a laser so that the first pixel electrode 301 are connected to the second pixel electrode 302 via the repair line.

In an embodiment, in the liquid crystal display panel, the first pixel electrode 301 is connected to the third pixel electrode 303 via the repair line. Both the first pixel electrode 301 and the third pixel electrode 303 belong to the first pixel and belong to the intra-pixel common pixel circuit 307. The repair line is disposed under film layers of the pixel electrode extension 201 of the first pixel electrode 301 and the pixel electrode extension 201 of the third pixel electrode 303. When the first pixel electrode 301 presents a bright spot, the pixel electrode extension of the first pixel electrode 301 and the pixel electrode extension of the third pixel electrode 303 are irradiated by a laser so that the first pixel electrode 301 are connected to the third pixel electrode 303 via the repair line.

In an embodiment, in the liquid crystal display panel, the first pixel electrode 301 is connected to the fourth pixel electrode 304 via the repair line. Both the first pixel electrode 301 and the fourth pixel electrode 304 belong to two pixels that are correspondingly disposed and belong to the intra-pixel common pixel circuit 307. The repair line is disposed under film layers of the pixel electrode extension 201 of the first pixel electrode 301 and the pixel electrode extension 201 of the fourth pixel electrode 304. When the first pixel electrode 301 presents a bright spot, the pixel electrode extension of the first pixel electrode 301 and the pixel electrode extension of the fourth pixel electrode 304 are irradiated by a laser so that the first pixel electrode 301 are connected to the fourth pixel electrode 304 via the repair line.

In an embodiment, in the liquid crystal display panel, the first pixel electrode 301 is connected to the fifth pixel electrode 305 via the repair line. Both the first pixel electrode 301 and the fifth pixel electrode 305 belong to two pixels that are correspondingly disposed and belong to the intra-pixel common pixel circuit 307. The repair line is disposed under film layers of the pixel electrode extension 201 of the first pixel electrode 301 and the pixel electrode extension 201 of the fifth pixel electrode 305. When the first pixel electrode 301 presents a bright spot, the pixel electrode extension of the first pixel electrode 301 and the pixel electrode extension of the fifth pixel electrode 305 are irradiated by a laser so that the first pixel electrode 301 are connected to the fifth pixel electrode 305 via the repair line.

In an embodiment, in the liquid crystal display panel, the first pixel electrode 301 is connected to the sixth pixel electrode 306 via the repair line. Both the first pixel electrode 301 and the sixth pixel electrode 306 belong to two pixels that are correspondingly disposed and belong to the intra-pixel common pixel circuit 307. The repair line is disposed under film layers of the pixel electrode extension 201 of the first pixel electrode 301 and the pixel electrode extension 201 of the sixth pixel electrode 306. When the first pixel electrode 301 presents a bright spot, the pixel electrode extension of the first pixel electrode 301 and the pixel electrode extension of the sixth pixel electrode 306 are irradiated by a laser so that the first pixel electrode 301 are connected to the sixth pixel electrode 306 via the repair line.

In an embodiment, in the OLED display panel, the first pixel electrode 301 is connected to the third pixel electrode 303 via the repair line. Both the first pixel electrode 301 and the third pixel electrode 303 belong to the first pixel and belong to the intra-pixel common pixel circuit 307. The repair line is disposed under film layers of the pixel electrode extension 201 of the first pixel electrode 301 and the pixel electrode extension 201 of the third pixel electrode 303. When the first pixel electrode 301 presents a bright spot, the pixel electrode extension of the first pixel electrode 301 and the pixel electrode extension of the third pixel electrode 303 are irradiated by a laser so that the first pixel electrode 301 are connected to the third pixel electrode 303 via the repair line.

In an embodiment, in the OLED display panel, the first pixel electrode 301 is connected to the fourth pixel electrode 304 via the repair line. Both the first pixel electrode 301 and the fourth pixel electrode 304 belong to two pixels that are correspondingly disposed and belong to the intra-pixel common pixel circuit 307. The repair line is disposed under film layers of the pixel electrode extension 201 of the first pixel electrode 301 and the pixel electrode extension 201 of the fourth pixel electrode 304. When the first pixel electrode 301 presents a bright spot, the pixel electrode extension of the first pixel electrode 301 and the pixel electrode extension of the fourth pixel electrode 304 are irradiated by a laser so that the first pixel electrode 301 are connected to the fourth pixel electrode 304 via the repair line.

In an embodiment, in the OLED display panel, the first pixel electrode 301 is connected to the fifth pixel electrode 305 via the repair line. Both the first pixel electrode 301 and the fifth pixel electrode 305 belong to two pixels that are correspondingly disposed and belong to the intra-pixel common pixel circuit 307. The repair line is disposed under film layers of the pixel electrode extension 201 of the first pixel electrode 301 and the pixel electrode extension 201 of the fifth pixel electrode 305. When the first pixel electrode 301 presents a bright spot, the pixel electrode extension of the first pixel electrode 301 and the pixel electrode extension of the fifth pixel electrode 305 are irradiated by a laser so that the first pixel electrode 301 are connected to the fifth pixel electrode 305 via the repair line.

In an embodiment, in the OLED display panel, the first pixel electrode 301 is connected to the sixth pixel electrode 306 via the repair line. Both the first pixel electrode 301 and the sixth pixel electrode 306 belong to two pixels that are correspondingly disposed and belong to the intra-pixel common pixel circuit 307. The repair line is disposed under film layers of the pixel electrode extension 201 of the first pixel electrode 301 and the pixel electrode extension 201 of the sixth pixel electrode 306. When the first pixel electrode 301 presents a bright spot, the pixel electrode extension of the first pixel electrode 301 and the pixel electrode extension of the sixth pixel electrode 306 are irradiated by a laser so that the first pixel electrode 301 are connected to the sixth pixel electrode 306 via the repair line.

The display device including a display panel provided by the present disclosure is as shown in FIG. 2 and the dotted frame is a position of an insulating layer that needs to be punctured by a laser when the sub-pixel presents a bright spot. The display panel includes a substrate 101, a driving circuit layer 102, a pixel electrode layer 103, a repair line layer 104, and an insulating layer. The driving circuit layer 102 is disposed on the substrate to form a signal electrode for driving the thin-film transistor. The signal electrode is a source electrode or a drain electrode. The pixel electrode layer 103 is patterned to form a plurality of pixel electrodes of sub-pixel units. Each of the pixel electrode includes a pixel electrode body 202 and a pixel electrode extension 201 that are electrically connected to each other. The pixel electrode body 202 is positioned within the light-emitting section and the pixel electrode body 202 is electrically connected to the signal electrode of the corresponding sub-pixel unit via a pixel signal line. The pixel electrode extension is positioned within the light-shielding section. The repair line layer 104 is patterned to form a repair line. The insulating layer is positioned between the repair line layer 104 and the pixel electrode layer 103. A projection of the pixel electrode extension 201 on the substrate partially overlaps a projection of the repair line on the substrate. When the insulating layer of the overlapping section is perforated, the pixel electrode extension 201 is electrically connected to the signal electrodes of the other sub-pixel units via the repair line.

In the present embodiment, a display device is provided, including a display panel. The display panel includes a substrate, a driving circuit layer, a pixel electrode layer, a repair line layer, and an insulating layer. The driving circuit layer is disposed on the substrate to form a signal electrode for driving the thin-film transistor. The signal electrode is a source electrode or a drain electrode. The pixel electrode layer is patterned to form a plurality of pixel electrodes of sub-pixel units. Each of the pixel electrode includes a pixel electrode body and a pixel electrode extension that are electrically connected. The pixel electrode body is positioned within a light-emitting section. The pixel electrode body is electrically connected to the signal electrode of the corresponding sub-pixel unit via a pixel signal line. The pixel electrode extension is positioned within the light-shielding section. The repair line layer is patterned to form a repair line. The insulating layer is positioned between the repair line layer and the pixel electrode layer. A projection of the pixel electrode extension on the substrate partially overlaps a projection of the repair line on the substrate. When the insulating layer of the overlapping section is perforated, the pixel electrode extension is electrically connected to the signal electrodes of the other sub-pixel units via the repair line. Therefore, when the sub-pixel unit presents a bright spot, the pixel electrode of the sub-pixel unit is disconnected from the corresponding pixel circuit, and then the pixel electrode extension is connected to the signal electrode of the other sub-pixel units via the repair line by the laser to emit light, thereby solving the technical problem that existing display panels have a limited effect on repairing bright spots.

In an embodiment, in the display device, as shown in FIG. 2, the source drain layer 409 and the repair line layer 104 are disposed in a same layer. The repair line layer 104 is patterned to form a repair line, and a source of the thin-film transistor, and a drain of the thin-film transistor.

In an embodiment, in the display device, as shown in FIG. 3, a connectional though hole k1 is defined on the insulating layer. A projection of one end of the repair line on the substrate overlaps a projection of the pixel electrode extension 201 of one sub-pixel unit. Another end of the repair line is connected to the pixel electrode of another sub-pixel unit via the connectional though hole k1.

In an embodiment, in the display device, as shown in FIG. 4, the repair line layer 104 includes a first repair line layer 1041 and a second repair line layer 1042. The first repair line layer 1041 and the second repair line layer 1042 are connected by the repair line though hole and are patterned to form a repair line.

In an embodiment, in the display device, as shown in FIG. 5, the light-shielding layer 401 and the repair line layer 104 are disposed in a same layer. The repair line layer 104 is patterned to form a repair line and a light-shielding layer 401 corresponding to the position of the thin-film transistor.

In an embodiment, both ends of the repair line are respectively insulated from the pixel electrode extensions 201 of the two sub-pixel units, and the projections coincide on the substrate.

In an embodiment, the insulating layer is disposed with a connectional though hole, one end of the repair line is projected onto the substrate 101 with the pixel electrode extension of one sub-pixel unit. Projections of the ends of the repair line on the substrate 101 overlaps projections of the pixel electrode extensions of the two sub-pixel units on the substrate, respectively.

In an embodiment, in the display device, a portion of the repair line is used as a light-shielding layer.

In an embodiment, in the display device, as shown in FIG. 6, the active layer 404 and the repair line layer 104 are disposed in a same layer. The active layer is patterned to form the repair line layer 104.

In an embodiment, in the display device, as shown in FIG. 7, the first metal layer 406 and the repair line layer 104 are disposed in a same layer. The repair line layer 104 is patterned to form a repair line, a gate of the low temperature polysilicon thin-film transistor, and a first electrode plate of a storage capacitor.

In an embodiment, in the display device, as shown in FIG. 8, the second metal layer 408 and the repair line layer 104 are disposed in a same layer. The repair line layer 104 is patterned to form a repair line, a gate of the metal semiconductor oxide thin-film transistor, and a second electrode plate of a storage capacitor.

In an embodiment, in the display device, as shown in FIG. 9, the display panel includes a plurality of sub-pixel units disposed in an array. When the insulating layer of the overlapping section is perforated, the pixel electrode extension is electrically connected to the signal electrode of the adjacent sub-pixel unit via the repair line.

In an embodiment, in the display device, as shown in FIG. 9, the display panel includes a plurality of pixel units disposed in an array. The pixel unit includes a plurality of sub-pixel units having different colors of light; when the insulating layer of the overlapping area is perforated, the pixel electrode extension is electrically connected to the signal electrodes of the sub-pixel units that has a same color of light in the adjacent pixel units via the repair line is.

In an embodiment, in a liquid crystal display device, the liquid crystal display panel includes a substrate 101, a light-shielding layer 401, a buffer layer 402, and a driving circuit layer 102 that are stacked in turn. The driving circuit layer 102 includes an active layer 404, a gate insulating layer 403, a first metal layer 406, a first inter-insulating layer 405, a second metal layer 408, a second inter-insulating layer 407, a source/drain layer 409, a planarization layer 410, a pixel electrode layer 105, and an alignment film that are stacked in turn. The repair line layer 104 is disposed between the substrate 101 and the planarization layer 410.

In an embodiment, in the liquid crystal display device, the repairing line layer 104 is disposed between the substrate 101 and the light-shielding layer 401. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In an embodiment, in the liquid crystal display device, the repairing line layer 104 is disposed between the light-shielding layer 401 and a buffer layer 402. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In an embodiment, in the liquid crystal display device, the repairing line layer 104 is disposed between the buffer layer 402 and a gate insulating layer 403. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In an embodiment, in the liquid crystal display device, the repairing line layer 104 is disposed between the gate insulating layer 403 and a first inter-insulating layer 405. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In an embodiment, in the liquid crystal display device, the repairing line layer 104 is disposed between the first inter-insulating layer 405 and a second inter-insulating layer 407. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In an embodiment, in the liquid crystal display device, the repairing line layer 104 is disposed between the second inter-insulating layer 407 and a planarization layer 410. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In an embodiment, in an organic light-emitting diode (OLED) display device, as shown in FIG. 10, the display panel is an OLED display panel, and the OLED display panel includes a substrate 101, a light-shielding layer 401, a buffer layer 402, and a driving circuit layer 102 that are stacked in turn. The driving circuit layer 102 includes an active layer 404, a gate insulating layer 403, a first metal layer 406, a first inter-insulating layer 405, a second metal layer 408, a second inter-insulating layer 407, a source/drain layer 409, a planarization layer 410, a pixel definition layer 105, a pixel electrode layer 103, a light-emitting function layer, a common electrode layer, and an encapsulation layer that are stacked in turn. The encapsulation layer is disposed between the substrate and the encapsulation layer.

In an embodiment, in the OLED display device, as shown in FIG. 10, in the OLED display device, the display panel includes a pixel defining layer. The pixel electrode extension 201 is disposed on the pixel defining layer. A laser is required for the pixel electrode extension 201 to penetrate the pixel defining layer in order to electrically connect to the repair line.

In an embodiment, in the OLED display device, the display panel includes a pixel defining layer. The pixel electrode extension 201 is integrally formed with the pixel electrode body 202. The pixel electrode extension 201 is positioned between the pixel defining layer 105 and the planarization layer 410. The pixel electrode extension 201 does not require a laser to penetrate the pixel definition layer to electrically connect to the repair line.

In an embodiment, in the OLED display device, the common electrode layer and the repair line layer are disposed in a same layer. The common electrode layer is patterned to form a repair line and a common electrode. The repair line is insulated from the common electrode.

In an embodiment, in the OLED display device, the pixel defining layer 105 is patterned to form a protruding section to define a light-emitting section. The pixel electrode extension 201 is positioned within the protruding section.

In an embodiment, in the OLED display device, the pixel electrode extension is disposed separately from the pixel electrode body. The pixel electrode extension is laid on a top surface of the protruding section and an incline of a corresponding light-emitting section of the protruding section. The pixel electrode extension is connected to the pixel electrode body.

In an embodiment, in the OLED display device, as shown in FIG. 10, the repair line layer is formed by extending the source drain layer 409. The pixel electrode extension overlaps a projection of the repair line layer on the substrate.

In an embodiment, in the OLED display device, the repair line is positioned within the protruding section.

In an embodiment, in the OLED display device, as shown in FIG. 11, the light-shielding layer 401 and the repair line layer are disposed in a same layer. The light-shielding layer 401 is patterned to form a repair line layer.

In an embodiment, in the OLED display device, as shown in FIG. 12, the active layer 404 and the repair line layer are disposed in a same layer. The active layer 404 is patterned to form a repair line layer.

In an embodiment, in the OLED display device, as shown in FIG. 13, the first metal layer 406 and the repair line layer are disposed in a same layer. The first metal layer 406 is patterned to form the repair line layer. The second metal layer 408 and the repair line layer is disposed in a same layer. The second metal layer 408 is patterned to form a repair line layer.

In an embodiment, in the OLED display device, as shown in FIG. 14, the second metal layer 408 and the repair line layer are disposed in a same layer. The second metal layer 408 is patterned to form a repair line layer.

In an embodiment, in the OLED display device, the repair line is positioned within the protruding section.

In one embodiment, in the OLED display device, the repairing line layer 104 is disposed between the substrate 101 and the light-shielding layer 401. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In one embodiment, in the OLED display device, the repairing line layer 104 is disposed between the light-shielding layer 401 and a buffer layer 402. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In one embodiment, in the OLED display device, the repairing line layer 104 is disposed between the buffer layer 402 and a gate insulating layer 403. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In one embodiment, in the OLED display device, the repairing line layer 104 is disposed between the gate insulating layer 403 and a first inter-insulating layer 405. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In one embodiment, in the OLED display device, the repairing line layer 104 is disposed between the first inter-insulating layer 405 and a second inter-insulating layer 407. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In one embodiment, in the OLED display device, the repairing line layer 104 is disposed between the second inter-insulating layer 407 and a source and drain layer 409. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In one embodiment, in the OLED display device, the repairing line layer 104 is disposed between the source and drain layer 409 and a planarization layer 410. When a pixel electrode presents a bright spot, the pixel electrode extension 201 of the pixel electrode that presents the bright spot is connected to the repair line at the repair line layer 104 by a laser. The pixel electrode extension 201 of the pixel electrode is connected to the pixel electrode extension 201 of the pixel electrode that presents the bright spot by the repair line at the repair line layer 104, so that the pixel electrode in which the bright spot failure occurs is restored to emit light.

In an embodiment, one end of the repair line is connected to the pixel electrode extension 201 to be repaired. A projection of another end of the repair line on the substrate 101 overlaps the pixel electrode extension on a same row. The pixels on the same row include the same pixels and different pixels.

In an embodiment, in the OLED display device, as shown in FIG. 15, the pixel electrode extension 201 is disposed adjacent to the light-emitting section of the next pixel electrode. In the OLED display panel, the pixel electrode extension 201 is adjacent to the next light-emitting section of the next pixel electrode. Therefore, such arrangement of the pixel electrode extension 201 can achieve a good connection effect.

In an embodiment, in the OLED display device, as shown in FIG. 15, an entire layer of the repair line is disposed in a strip shape. The projection of the repair line on the substrate overlaps the projections of all of the pixel electrode extensions.

In an embodiment, in the OLED display device, as shown in FIG. 16, two oppositely disposed pixels are used as an example. The pixels can be divided into pixels electrodes of six sub-pixels as follows: a first pixel electrode 301, a second pixel electrode 302, a third pixel electrode 303, a fourth pixel electrode 304, a fifth pixel electrode 305, and a sixth pixel electrode 306. The pixels further include a pixel circuit 307.

In an embodiment, in the OLED display device, the first pixel electrode 301 is connected to the second pixel electrode 302 via the repair line. Both the first pixel electrode 301 and the second pixel electrode 302 belong to the first pixel and belong to the intra-pixel common pixel circuit 307. The repair line is disposed under film layers of the pixel electrode extension 201 of the first pixel electrode 301 and the pixel electrode extension 201 of the second pixel electrode 302. When the first pixel electrode 301 presents a bright spot, the pixel electrode extension of the first pixel electrode 301 and the pixel electrode extension of the second pixel electrode 302 are irradiated by a laser so that the first pixel electrode 301 are connected to the second pixel electrode 302 via the repair line.

In an embodiment, in the liquid crystal display device, the first pixel electrode 301 is connected to the third pixel electrode 303 via the repair line. Both the first pixel electrode 301 and the third pixel electrode 303 belong to the first pixel and belong to the intra-pixel common pixel circuit 307. The repair line is disposed under film layers of the pixel electrode extension 201 of the first pixel electrode 301 and the pixel electrode extension 201 of the third pixel electrode 303. When the first pixel electrode 301 presents a bright spot, the pixel electrode extension of the first pixel electrode 301 and the pixel electrode extension of the third pixel electrode 303 are irradiated by a laser so that the first pixel electrode 301 are connected to the third pixel electrode 303 via the repair line.

In an embodiment, in the liquid crystal display device, the first pixel electrode 301 is connected to the fourth pixel electrode 304 via the repair line. Both the first pixel electrode 301 and the fourth pixel electrode 304 belong to two pixels that are correspondingly disposed and belong to the intra-pixel common pixel circuit 307. The repair line is disposed under film layers of the pixel electrode extension 201 of the first pixel electrode 301 and the pixel electrode extension 201 of the fourth pixel electrode 304. When the first pixel electrode 301 presents a bright spot, the pixel electrode extension of the first pixel electrode 301 and the pixel electrode extension of the fourth pixel electrode 304 are irradiated by a laser so that the first pixel electrode 301 are connected to the fourth pixel electrode 304 via the repair line.

In an embodiment, in the liquid crystal display device, the first pixel electrode 301 is connected to the fifth pixel electrode 305 via the repair line. Both the first pixel electrode 301 and the fifth pixel electrode 305 belong to two pixels that are correspondingly disposed and belong to the intra-pixel common pixel circuit 307. The repair line is disposed under film layers of the pixel electrode extension 201 of the first pixel electrode 301 and the pixel electrode extension 201 of the fifth pixel electrode 305. When the first pixel electrode 301 presents a bright spot, the pixel electrode extension of the first pixel electrode 301 and the pixel electrode extension of the fifth pixel electrode 305 are irradiated by a laser, so that the first pixel electrode 301 are connected to the fifth pixel electrode 305 via the repair line.

In an embodiment, in the liquid crystal display device, the first pixel electrode 301 is connected to the sixth pixel electrode 306 via the repair line. Both the first pixel electrode 301 and the sixth pixel electrode 306 belong to two pixels that are correspondingly disposed and belong to the intra-pixel common pixel circuit 307. The repair line is disposed under film layers of the pixel electrode extension 201 of the first pixel electrode 301 and the pixel electrode extension 201 of the sixth pixel electrode 306. When the first pixel electrode 301 presents a bright spot, the pixel electrode extension of the first pixel electrode 301 and the pixel electrode extension of the sixth pixel electrode 306 are irradiated by a laser so that the first pixel electrode 301 are connected to the sixth pixel electrode 306 via the repair line.

In an embodiment, in the OLED display device, the first pixel electrode 301 is connected to the third pixel electrode 303 via the repair line. Both the first pixel electrode 301 and the third pixel electrode 303 belong to the first pixel and belong to the intra-pixel common pixel circuit 307. The repair line is disposed under film layers of the pixel electrode extension 201 of the first pixel electrode 301 and the pixel electrode extension 201 of the third pixel electrode 303. When the first pixel electrode 301 presents a bright spot, the pixel electrode extension of the first pixel electrode 301 and the pixel electrode extension of the third pixel electrode 303 are irradiated by a laser so that the first pixel electrode 301 are connected to the third pixel electrode 303 via the repair line.

In an embodiment, in the OLED display device, the first pixel electrode 301 is connected to the fourth pixel electrode 304 via the repair line. Both the first pixel electrode 301 and the fourth pixel electrode 304 belong to two pixels that are correspondingly disposed and belong to the intra-pixel common pixel circuit 307. The repair line is disposed under film layers of the pixel electrode extension 201 of the first pixel electrode 301 and the pixel electrode extension 201 of the fourth pixel electrode 304. When the first pixel electrode 301 presents a bright spot, the pixel electrode extension of the first pixel electrode 301 and the pixel electrode extension of the fourth pixel electrode 304 are irradiated by a laser so that the first pixel electrode 301 are connected to the fourth pixel electrode 304 via the repair line.

In an embodiment, in the OLED display device, the first pixel electrode 301 is connected to the fifth pixel electrode 305 via the repair line. Both the first pixel electrode 301 and the fifth pixel electrode 305 belong to two pixels that are correspondingly disposed and belong to the intra-pixel common pixel circuit 307. The repair line is disposed under film layers of the pixel electrode extension 201 of the first pixel electrode 301 and the pixel electrode extension 201 of the fifth pixel electrode 305. When the first pixel electrode 301 presents a bright spot, the pixel electrode extension of the first pixel electrode 301 and the pixel electrode extension of the fifth pixel electrode 305 are irradiated by a laser so that the first pixel electrode 301 are connected to the fifth pixel electrode 305 via the repair line.

In an embodiment, in the OLED display device, the first pixel electrode 301 is connected to the sixth pixel electrode 306 via the repair line. Both the first pixel electrode 301 and the sixth pixel electrode 306 belong to two pixels that are correspondingly disposed and belong to the intra-pixel common pixel circuit 307. The repair line is disposed under film layers of the pixel electrode extension 201 of the first pixel electrode 301 and the pixel electrode extension 201 of the sixth pixel electrode 306. When the first pixel electrode 301 presents a bright spot, the pixel electrode extension of the first pixel electrode 301 and the pixel electrode extension of the sixth pixel electrode 306 are irradiated by a laser so that the first pixel electrode 301 are connected to the sixth pixel electrode 306 via the repair line.

According to the above embodiment, understandably, the present disclosure provides a display panel and a display device. The display panel includes a substrate, a driving circuit layer, a pixel electrode layer, a repair line layer, and an insulating layer. The driving circuit layer is disposed on the substrate to form a signal electrode for driving the thin-film transistor. The signal electrode is a source electrode or a drain electrode. The pixel electrode layer is patterned to form a plurality of pixel electrodes of sub-pixel units. Each of the pixel electrode includes a pixel electrode body and a pixel electrode extension that are electrically connected. The pixel electrode body is positioned within a light-emitting section. The pixel electrode body is electrically connected to the signal electrode of the corresponding sub-pixel unit via a pixel signal line. The pixel electrode extension is positioned within the light-shielding section. The repair line layer is patterned to form a repair line. The insulating layer is positioned between the repair line layer and the pixel electrode layer. A projection of the pixel electrode extension on the substrate partially overlaps a projection of the repair line on the substrate. When the insulating layer of the overlapping section is perforated, the pixel electrode extension is electrically connected to the signal electrodes of the other sub-pixel units via the repair line. Therefore, when the sub-pixel unit presents a bright spot, the pixel electrode of the sub-pixel unit is disconnected from the corresponding pixel circuit, and then the pixel electrode extension is connected to the signal electrode of the other sub-pixel units via the repair line by the laser to emit light, thereby solving the technical problem that existing display panels have a limited effect on repairing bright spots.

In summary, although the present disclosure has been described with preferred embodiments thereof, the above preferred embodiments is not used to limit the present disclosure. One of ordinarily skill in the art can carry out changes and modifications to the described embodiment without departing from the scope and the spirit of the disclosure that is intended to be limited only by the appended claims.

What is claimed is:

1. A display panel, comprising:
   a substrate;
   a driving circuit layer disposed on the substrate to form a signal electrode for driving a thin film transistor, wherein the signal electrode is a source electrode or a drain electrode;
   a pixel electrode layer patterned to form a plurality of pixel electrodes of sub-pixel units, wherein each of the pixel electrode comprises a pixel electrode body and a pixel electrode extension that are electrically connected to each other; the pixel electrode body is positioned within a light-emitting section, the pixel electrode body is electrically connected to the signal electrode of the corresponding sub-pixel unit via a pixel signal line, and the pixel electrode extension is positioned within the light-shielding area;
   a repair line layer patterned to form a repair line; and
   an insulating layer positioned between the repair line layer and the pixel electrode extension in a vertical direction;
   wherein a projection of the pixel electrode extension on the substrate partially overlaps a projection of the repair line on the substrate, a projection of the insulating layer on the substrate partially overlaps the projection of the pixel electrode extension on the substrate and the projection of the repair line on the substrate, and when the insulating layer of an overlapping section where the pixel electrode extension, the insulating layer, and the repair line are vertically overlapped with each other is perforated along the vertical direction, the pixel electrode extension is electrically connected to the signal electrode of the other sub-pixel unit via the repair line.

2. The display panel according to claim 1, wherein the display panel comprises a plurality of sub-pixel units disposed in an array, and when the insulating layer of the overlapping section is perforated along the vertical direction, the pixel electrode extension is electrically connected to the signal electrode of the adjacent sub-pixel units via the repair line.

3. The display panel according to claim 1, wherein both ends of the repair line are independently insulated from the pixel electrode extensions of the two sub-pixel units, and projections of the ends of the repair line on the substrate overlap projections of the pixel electrode extensions of the two sub-pixel units on the substrate, respectively.

4. The display panel according to claim 1, wherein a connectional though hole is defined on the insulating layer, and a projection of one end of the repair line on the substrate overlaps a projection of a pixel electrode extension of one of the sub-pixel units on the substrate, and another end of the repair line is electrically connected to the pixel electrode extension of another sub-pixel unit via the connectional though hole.

5. The display panel according to claim 1, wherein a connectional though hole is defined on the insulating layer, a projection of one end of the repair line on the substrate overlaps a projection of a pixel electrode extension of one sub-pixel units on the substrate, and another end of the repair line is directly electrically connected to the signal electrode of another sub-pixel unit.

6. The display panel according to claim 1, wherein the display panel is a liquid crystal display panel, the liquid crystal display panel comprises the substrate, a light-shielding layer, a buffer layer and the driving circuit layer that are stacked in turn, the driving circuit layer comprises an active layer, a gate insulating layer, a first metal layer, a first inter-insulating layer, a second metal layer, a second inter-insulating layer, a source and drain layer, a planarization layer, the pixel electrode layer, and an alignment film layer that are stacked in turn, and the repair line layer is disposed between the substrate and the planarization layer.

7. The display panel according to claim 6, wherein the light-shielding layer and the repair line layer are disposed on a same layer, and the repair line layer is patterned to form the repair line and a light-shielding layer that corresponds to a position of the thin film transistor.

8. The display panel of claim 6, wherein the source and drain layer and the repair line layer are disposed in a same layer, the repair line layer is patterned to form the repair line, a source of the thin film transistor, and a drain of the thin film transistor.

9. The display panel of claim 1, wherein the display panel is an organic light-emitting diode (OLED) display panel, the OLED display panel comprises the substrate, a light-shielding layer, a buffer layer and the driving circuit layer that are stacked in turn, the driving circuit layer comprises an active layer, a gate insulating layer, a first metal layer, a first inter-insulating layer, a second metal layer, a second inter-insulating layer, a source and drain layer, a planarization layer, a pixel defining layer, the pixel electrode layer, a light-emitting function layer, a common electrode layer, and an encapsulation layer that are stacked in turn, and the repair line layer is disposed between the substrate and the encapsulation layer.

10. The display panel according to claim 9, wherein the common electrode layer and the repair line layer are disposed in the same layer, the common electrode layer is patterned to form the repair line and a common electrode, and the repair line is insulated from the common electrode.

11. The display panel according to claim 10, wherein the pixel defining layer is patterned to form a protruding section, the protruding section is configured to define the light-emitting section, and the pixel electrode extension is positioned within the protruding section.

12. The display panel according to claim 11, wherein the pixel electrode extension is integrally formed with the pixel electrode body and the pixel electrode extension is positioned between the pixel defining layer and the planarization layer.

13. The display panel according to claim 11, wherein the pixel electrode extension is disposed separately from the pixel electrode body, the pixel electrode extension is laid on a top surface of the protruding section and an incline of a corresponding light-emitting section of the protruding section, and the pixel electrode extension is connected to the pixel electrode body.

* * * * *